(12) United States Patent
Paul

(10) Patent No.: US 9,966,738 B2
(45) Date of Patent: May 8, 2018

(54) FRAME SECTION FOR A FRAMEWORK OF A SWITCHGEAR CABINET

(71) Applicant: RITTAL GMBH & CO. KG, Herborn (DE)

(72) Inventor: Hartmut Paul, Breitscheid (DE)

(73) Assignee: RITTAL GMBH & CO. KG (DE)

( * ) Notice: Subject to any disclaimer, the term of this patent is extended or adjusted under 35 U.S.C. 154(b) by 0 days. days.

(21) Appl. No.: 15/116,770

(22) PCT Filed: Jan. 28, 2015

(86) PCT No.: PCT/DE2015/100033
§ 371 (c)(1),
(2) Date: Aug. 4, 2016

(87) PCT Pub. No.: WO2015/117596
PCT Pub. Date: Aug. 13, 2015

(65) Prior Publication Data
US 2016/0352079 A1 Dec. 1, 2016

(30) Foreign Application Priority Data
Feb. 5, 2014 (DE) .......... 10 2014 101 402

(51) Int. Cl.
H02B 1/01 (2006.01)
H05K 7/18 (2006.01)

(52) U.S. Cl.
CPC ............. *H02B 1/013* (2013.01); *H02B 1/014* (2013.01); *H05K 7/18* (2013.01)

(58) Field of Classification Search
CPC .......... H02B 1/013; H02B 1/014; H02B 1/01; H02B 1/306; H05K 7/18; A47B 87/00
(Continued)

(56) References Cited

U.S. PATENT DOCUMENTS 3,891,288 A * 6/1975 Marquette ............... B62B 3/006
211/151
4,158,998 A * 6/1979 Clement ................ A47B 57/16
108/147.15
(Continued)

FOREIGN PATENT DOCUMENTS

DE 4336187 A1 4/1995
DE 19536950 C1 11/1996
(Continued)

OTHER PUBLICATIONS

International Search Report (in English and German) and Written Opinion (in German) for PCT/DE2015/100033, dated Jun. 2, 2015; ISA/EP.
(Continued)

Primary Examiner — Ko H Chan
(74) Attorney, Agent, or Firm — Harness, Dickey & Pierce, PLC

(57) ABSTRACT

The disclosure describes a frame profile for a frame rack of a service cabinet, consisting of an outer profile part manufactured from a first material, wherein the outer profile part forms at least a first wall of the frame profile which partially limits a hollow chamber; and of an inner profile part manufactured from a second material which differs from the first material by at least one quality, wherein the inner profile part forms at least one other wall of the hollow chamber.

18 Claims, 3 Drawing Sheets

(58) Field of Classification Search
USPC .......................................................... 211/26
See application file for complete search history.

(56) References Cited

U.S. PATENT DOCUMENTS

| | | | | |
|---|---|---|---|---|
| 4,351,244 | A * | 9/1982 | Suttles | A47B 47/024 |
| | | | | 108/107 |
| 6,155,658 | A * | 12/2000 | Woodward | H02B 1/306 |
| | | | | 312/204 |
| 2002/0171341 | A1* | 11/2002 | Chandler | H02B 1/301 |
| | | | | 312/265.4 |
| 2007/0069613 | A1* | 3/2007 | DiNota | H05K 7/18 |
| | | | | 312/229 |
| 2012/0062084 | A1* | 3/2012 | Lewis, II | H05K 5/0234 |
| | | | | 312/223.6 |
| 2013/0221813 | A1* | 8/2013 | Maisch | H02B 1/01 |
| | | | | 312/107 |

FOREIGN PATENT DOCUMENTS

| | | |
|---|---|---|
| DE | 102014101401 A1 | 8/2015 |
| EP | 0789983 B1 | 7/1998 |
| EP | 1601074 B1 | 4/2007 |
| GB | 2121676 A | 1/1984 |

OTHER PUBLICATIONS

International Preliminary Report on Patentability (Chapter II) (in German) for PCT/DE2015/100033, dated Apr. 25, 2016; IPEA/EP.

\* cited by examiner

FRAME SECTION FOR A FRAMEWORK OF A SWITCHGEAR CABINET

CROSS-REFERENCE TO RELATED APPLICATIONS

This application is a 371 U.S. National Stage of International Application No. PCT/DE2015/100033, filed on Jan. 28, 2015, which claims priority to German Application No. 10 2014 101 402.2, filed on Feb. 5, 2014. The entire disclosures of the above applications are incorporated herein by reference.

FIELD

The disclosure relates to a frame profile for a frame rack of a service cabinet.

BACKGROUND

This section provides background information related to the present disclosure which is not necessarily prior art.

Frame profiles are known in many embodiments, profiles according to DE 195 36 950 C1, EP 0 789 983 B1 and EP 1 601 074 B1 are cited only by way of examples. All these profiles have a more or less complex structure, wherein there is a desire by the manufacturers and also by the users to save material and to have many functionalities available.

The disclosure therefore has the problem of making a frame profile available for a frame rack of a service cabinet which makes a savings of material possible with a uniform rigidity and portability for a suspension chassis.

According to the disclosure the frame profile consists of an outer profile part manufactured from a first material, wherein the outer profile part forms at least a first wall of the frame profile which partially limits a hollow chamber, and of an inner profile manufactured from a second material which differs from the first material by at least one quality, wherein the inner profile forms at least one other wall of the hollow chamber. For example, the outer profile part can consist of a material which is more resistant to corrosion than the material of the inner profile part.

It can also be provided that the thickness of the outer profile part differs from the thickness of the inner profile part, in particular is greater than the thickness of the inner profile part.

SUMMARY

This section provides a general summary of the disclosure, and is not a comprehensive disclosure of its full scope or all of its features.

A particularity of the frame profile according to the present disclosure consists of a hollow chamber, which is preferably open over the entire length of the frame profile. Therefore, an option space is available in the hollow chamber which can be used in many ways. Therefore, cables can be run through the hollow chamber, for example, for data lines, which are then screened by the material of the outer profile part and of the inner profile part and are therefore protected from disturbances.

It can also be provided that the hollow chamber is reinforced with a hard foam. Likewise, fillings with soft foam are conceivable so that the hollow chamber develops damping qualities. Even structures with open pores, in particular soft foams with open pores can be provided that allow a medium to be transported.

The hard foam or the soft form can be a foam based on polyester or polyurethane. Even metallic foams are conceivable as well as concrete and other inorganic or organic materials.

Therefore, a plurality of profiles with very different qualities is possible with the same functions and outside dimensions without the functional geometry being changed. Therefore, the hollow chamber can be shaped in such a manner that the profile qualities can be adjusted.

According to a preferred embodiment of the disclosure the outer profile part and the inner profile part can be brought together to at least one profile attachment which extends away from the hollow chamber. This therefore produces a straight-line web with an angular contour onto which an application seal can be set. The latter can be a customary lip seal but also a seal like the one forming subject matter of DE 10 2014 101 401 A1 filed at the same time.

Furthermore, it can be provided that the inner profile part is folded in order to form at least one profile attachment. Therefore, given only one half the material thickness a certain fastening thickness can be retained or the latter can be enlarged in spite of a clamping of the material. Therefore, sufficient material thickness is made available e.g. for sheet screws for which a minimum thickness is required.

The hollow chamber is preferably rectangular or quadratic in cross section but can also be constructed as a trapezoid or as a parallelogram, that is, like a rhombus. Furthermore, the profile attachment or the profile attachments is/are formed on edges of the hollow chamber. It is provided in this case that the profile attachments enclose an angle of 135° with the adjacent profile sides. In the case of four profile attachments on the four corners of the hollow chamber this results in a symmetrical frame profile whose profile attachments satisfy different requirements.

It is preferred that the folded profile attachments are provided with a perforation, preferably a system perforation. In the case of two such profile attachments several structural planes results so that work can be done with a suitable chassis with the same parts on the same fastening plane. The mounting of components is possible here from both sides of the particular profile attachment.

A frame rack can be built up from frame profiles according to the disclosure for a service cabinet in which such a frame profile is constructed at least as a vertical profile in order to be to utilize the improved possibilities of assembly. However, it is just as advantageous to also use the frame profile of the present disclosure as a horizontal profile, namely in the cover area as well as in the bottom area. Precisely in the bottom area the corner solution can then be made in a more material-saving manner if the inner profile part is constructed to be shorter than needed by the dimensions of the cabinet so that it does not have to be subsequently notched or only very little notched.

DRAWINGS

The drawings described herein are for illustrative purposes only of selected embodiments and not all possible implementations, and are not intended to limit the scope of the present disclosure.

The disclosure is explained in detail in the following using the attached drawings. The views are not necessarily true to size. In the drawings.

DETAILED DESCRIPTION

Example embodiments will now be described more fully with reference to the accompanying drawings.

Figure 1:
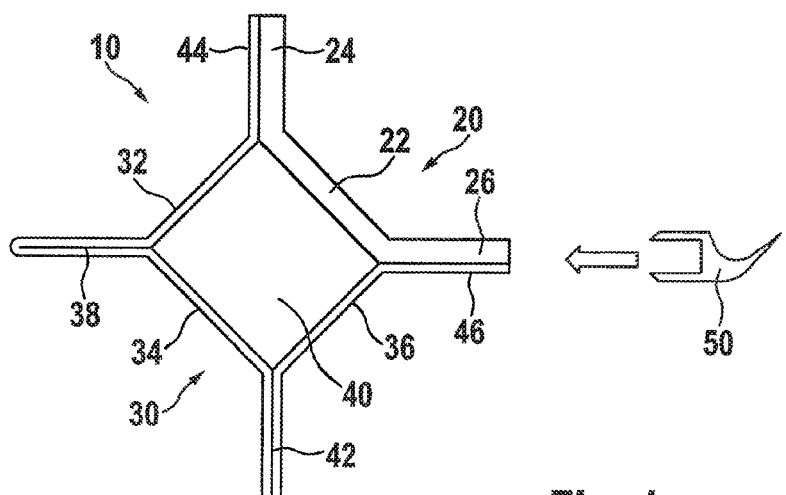
FIG. 1 shows a cross-sectional view of a frame profile according to the present disclosure.

FIG. 1 shows a cross-sectional view of a frame profile 10 of a service cabinet which comprises an outer profile part 20 manufactured from a first material. The outer profile part forms at least one first wall 22 of the frame profile 10 which partially limits a hollow chamber 40. Two attachments 24, 26 emanate from the first wall at an angle of about 135°. Furthermore, the frame profile 10 comprises an inner profile part 30 manufactured from a second material which differs from the first material in at least one quality. This can be a physical or a chemical quality, for example, the outer profile part 20 can be manufactured from a material which is more corrosion-resistant than the material of the inner profile part 30. Also, the outer profile part 20 has a wall thickness which is greater than the wall thickness of the inner profile part 30. The inner profile part 30 forms at least one other wall of the hollow chamber wherein in the exemplary embodiment shown three other walls 32, 34, 36 of the hollow chamber 40 are formed by the inner profile part 30. Therefore, this forms on the whole a hollow chamber 40 which is rectangular or quadric in cross section. Profile attachments are formed on the edges of the hollow chamber 40 which extend away from the hollow chamber 40. Two different types of profile attachments are preferred, to wit, on the one hand profile attachments which are formed from attachments 24, 26 of the outer profile part 20 and attachments 44, 46 of the inner profile part 30 which latter attachments are connected to them. Such a profile attachment, for example 26, 46 is in a straight line and has an angular outer contour so that an application seal 50 can be pushed on in a simple manner. Other profile attachments 38, 42 are formed in that the material of the inner profile part 30 is folded so that the profile attachments 38, 42 are designed so to say in a double layer from the material of the inner profile part 30. These folded profile attachments 38, 42 comprise perforations that can be better recognized in the FIGS. 2 and 3.

Figure 2:
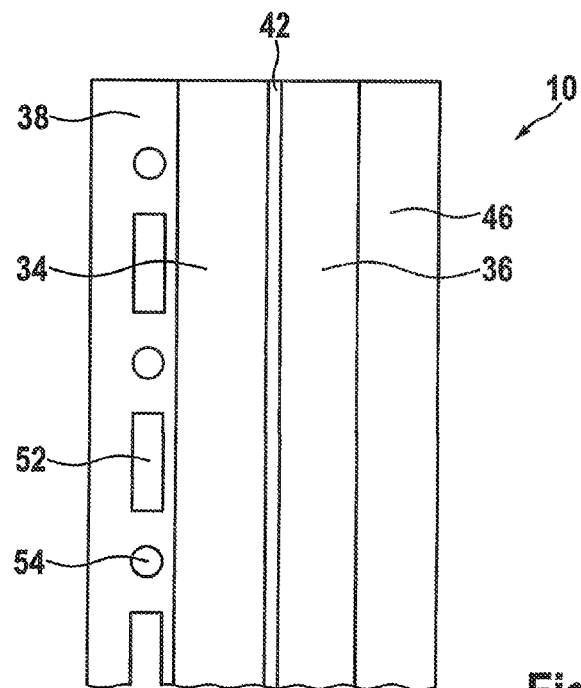
FIG. 2 shows a front view of the frame profile from FIG. 1.

The hollow chamber 40 can be used for running cables. Even fillings with hard foam or soft foam, for example based on polyester or polyurethane are possible in order to stiffen the frame profile 10 or to impart damping qualities to it. FIG. 2 shows a top view onto the profile of FIG. 1. The perforations can be recognized on the profile attachment 38 which consist of alternating rectangular and circular perforations 52, 54. Similar perforations which are also designated as system perforations, are provided in the profile attachment 42 but cannot be recognized there in the view. The profile attachments 38, 42 merge into one another via the wall 34, wherein they extend from the latter at an angle of approximately 135° (see FIG. 1). The profile attachment 42 merges into the attachment 46 via a wall 36, wherein the transitional angle is also on the order of 135°.

Figure 3:
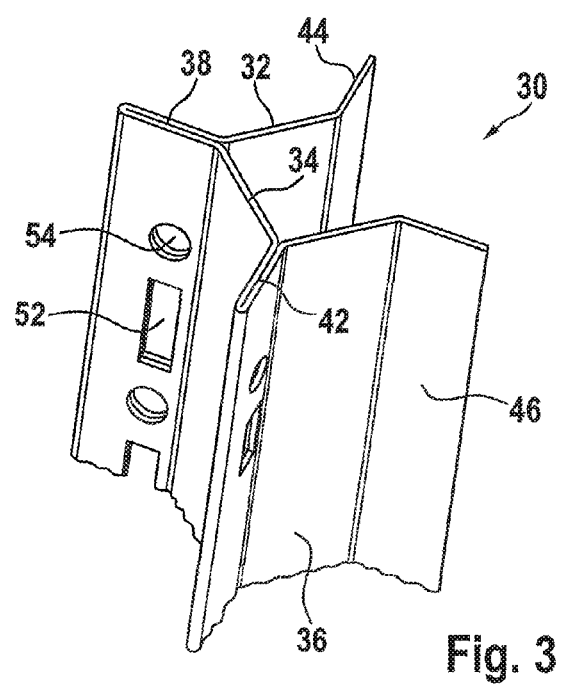
FIG. 3 shows a perspective view of an inner profile part.

The angular design of the inner profile part 30 can be clearly recognized in FIG. 3 which shows the inner profile part 30 in a perspective top view. The folded profile attachments 38, 42 show the system perforations of rectangles 52 and circular openings 54. Different system perforations are possible, for example 19" perforations or a metric perforating. As a result of the folding the profile attachments 38, 42 are constructed with a double wall thickness like the walls 32, 34 36 and the attachments 44, 46 so that the necessary stability for placing components is given. The inner profile part 30 can be manufactured as a sheet bending and stamping part and is then supplemented by an outer profile part (FIG. 2) to a frame profile 10 in accordance with the present invention.

Figure 4:
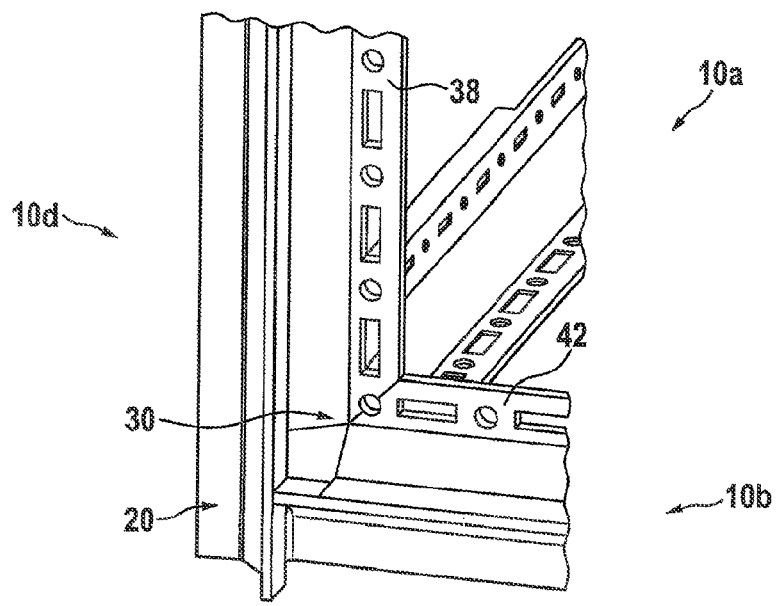
FIG. 4 shows a corner connection of 3 frame profiles according to the present disclosure in the cover area of a frame rack for a service cabinet.

A corner connection in the bottom area of a frame rack with frame profiles 10a, 10b and 10d in accordance with the present disclosure is shown in FIG. 4. The inner profile part 30 of the vertical frame profile 10d is shorter here than is required by the cabinet dimension. This means a savings of material and in addition no notching or only very little notching must be subsequently performed. The horizontal frame profiles 10a, 10b are cut to miter on their profile attachments 38, 42, wherein any still necessary adaptations of the inner profile part 30 to the geometry of the corner takes place. The outer profile part 20 does not have to be further processed.

Figure 5:
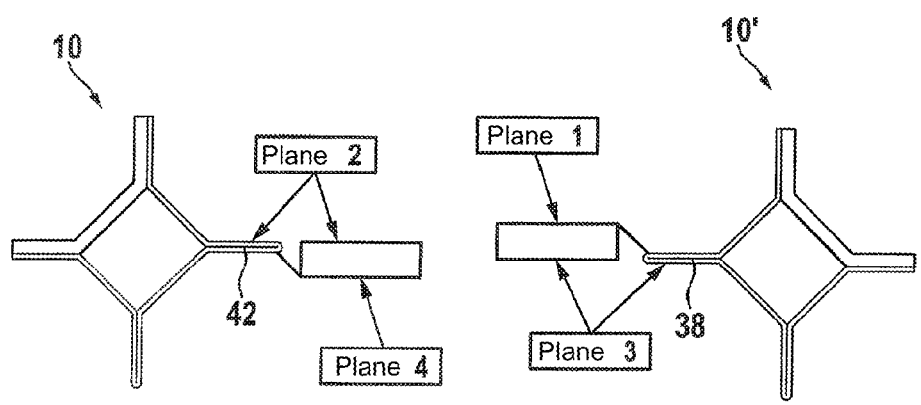
FIG. 5 shows a corner connection in the bottom area of a frame rack for a service cabinet.

FIG. 5 shows a cross-sectional view of a part of a frame rack constructed from frame profiles 10, 10' according to the present disclosure. An assembly of construction components, e.g. of the chassis, is made possible from both sides of the profile attachments 38, 42 by the perforated, folded profile attachments 38, 42. Therefore, different construction levels can be realized with the same parts on the same fastening plane with a suitable chassis as is shown by plane 1, plane 2, plane 3 and plane 4.

The frame profile according to the present disclosure therefore offers a savings of material without limiting the functionality.

The features of the disclosure disclosed in the present specification, the drawings and in the claims can be essential individually as well as in any combination for carrying out the disclosure.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A frame profile for a frame rack of a service cabinet comprising:
   an outer profile part manufactured from a first material, wherein the outer profile part forms a first wall of the frame profile which partially limits a hollow chamber; and
   an inner profile part manufactured from a second material which differs from the first material by at least one quality, wherein the inner profile part forms at least one other wall of the hollow chamber;
   wherein the hollow chamber is constructed to be continuous over the length of the frame profile and that the inner profile part is folded in order to form two profile attachments which are provided with perforations and which extend at an angle of 90° with respect to one another;
   wherein the inner profile part forms three other walls of the hollow chamber;

wherein the first wall of the outer profile part and the three other walls form the hollow chamber which is rectangular or quadric in cross-section; and wherein the two profile attachments which are provided with perforations are folded to comprise a double wall thickness compared to the three other walls.

2. The frame profile according to claim 1, wherein the thickness of the outer profile part differs from the thickness of the inner profile part.

3. The frame profile according to claim 1, wherein the hollow chamber is reinforced with a hard foam.

4. The frame profile according to claim 1, wherein the hollow chamber is reinforced with a soft foam.

5. The frame profile according to claim 4, wherein the hollow chamber is filled with the soft foam with open pores.

6. The frame profile according to claim 3, wherein the hard foam is a foam based on polyester or polyurethane.

7. The frame profile according to claim 1, wherein the hollow chamber is filled with an inorganic material including metallic foam or concrete.

8. The frame profile according to claim 1, wherein the outer profile part and the inner profile part are connected together to at least one profile attachment which extends away from the hollow chamber.

9. The frame profile according to claim 1, wherein the hollow chamber is rectangular, quadratic, trapezoidal or like a rhombus in cross section.

10. The frame profile according to claim 8, wherein the profile attachment or the profile attachments is/are constructed on edges of the hollow chamber.

11. The frame profile according to claim 1, wherein the two profile attachments that are orientated at an angle of 135° with respect to the three other walls of the hollow chamber.

12. The frame rack for a service cabinet in which a frame profile according to claim 1 is constructed at least as a vertical profile.

13. The frame profile according to claim 4, wherein the soft foam is a foam based on polyester or polyurethane.

14. The frame profile according to claim 5, wherein the soft foam is a foam based on polyester or polyurethane.

15. The frame profile of claim 1, wherein the inner profile part forms two profile attachments that extend perpendicular to each other, each one of the two profile attachments is provided with perforations.

16. A frame profile for a frame rack of a service cabinet comprising:

a first profile part manufactured from a first material, the first profile part forms a first wall of the frame profile that partially defines a hollow chamber;

a second profile part manufactured from a second material that is different from the first material;

the first and second profile parts connected together to form the hollow chamber having two wing sections extending outwardly therefrom, the first profile part defining a first region of side walls for the chamber, and the second profile part defining a different second region of side walls for the chamber;

the two wing sections being formed from folded sections of the second profile part;

the two wing sections having perforations therein;

the two wing sections extend at 90° angles with respect to one another;

the second profile part forms three other walls of the hollow chamber;

wherein the first wall of the first profile part and the three other walls of the second profile part define the hollow chamber, which is rectangular or quadric in cross-section; and wherein the two wing sections, which are provided with the perforations, are folded to provide each one of the two wing sections with a wall thickness that is twice as great as wall thicknesses of each of the three other walls.

17. The frame profile of claim 1, wherein the perforations in the two profile attachments are the only perforations of the frame profile.

18. The frame profile of claim 17, wherein a first and a second sheet metal layer of each of the two profile attachments abut against each other over the entire length and width of the respective profile attachment.

* * * * *